(12) United States Patent
Mazzola

(10) Patent No.: US 12,463,170 B2
(45) Date of Patent: Nov. 4, 2025

(54) SEMICONDUCTOR DEVICE AND ASSORTMENT OF SEMICONDUCTOR DEVICES WITH ELECTRICALLY CONDUCTIVE RIBBON CONFIGURATIONS

(71) Applicant: STMicroelectronics S.r.l., Agrate Brianza (IT)

(72) Inventor: Mauro Mazzola, Calvenzano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 421 days.

(21) Appl. No.: 17/881,921

(22) Filed: Aug. 5, 2022

(65) Prior Publication Data
US 2023/0049088 A1 Feb. 16, 2023

(30) Foreign Application Priority Data
Aug. 10, 2021 (IT) .......................... 102021000021638

(51) Int. Cl.
*H01L 23/00* (2006.01)
*H01L 23/495* (2006.01)
*H01L 25/065* (2023.01)

(52) U.S. Cl.
CPC ........ *H01L 24/40* (2013.01); *H01L 23/49544* (2013.01); *H01L 23/49558* (2013.01);
(Continued)

(58) Field of Classification Search
CPC ................................. H01L 24/10; H01L 24/40
(Continued)

(56) References Cited

U.S. PATENT DOCUMENTS 4,801,997 A * 1/1989 Ono .................. H01L 23/49541
174/536
5,532,905 A 7/1996 Moore
(Continued)

FOREIGN PATENT DOCUMENTS

CN 111646424 A 9/2020
CN 218957725 U 5/2023

OTHER PUBLICATIONS

IT Search Report and Written Opinion for priority application, IT 102021000021638, report dated Apr. 22, 2022, 8 pgs.
(Continued)

*Primary Examiner* — Ajay Arora
(74) *Attorney, Agent, or Firm* — Crowe & Dunlevy LLC

(57) ABSTRACT

A semiconductor device includes a pre-molded leadframe mounting substrate. The substrate includes a die pad (configured to have a semiconductor die mounted thereon) and a first electrically conductive pad and a second electrically conductive pad. A strip of insulating material is molded between the first and second electrically conductive pads to provide a mutually electrically insulation and extends in a longitudinal direction with the first electrically conductive pad and the second electrically conductive pad lying on opposite sides of the strip of insulating material. A semiconductor die is arranged on the die pad in register with the strip of insulating material. A single electrically conductive ribbon extending in register with the strip of insulating material electrically couples the semiconductor die with both the first and second electrically conductive pads to provide a common current flow path from the semiconductor die towards the first and the second electrically conductive pads.

11 Claims, 2 Drawing Sheets

(52) U.S. Cl.
CPC ........ *H01L 23/49575* (2013.01); *H01L 24/48* (2013.01); *H01L 24/73* (2013.01); *H01L 24/84* (2013.01); *H01L 24/85* (2013.01); *H01L 25/0655* (2013.01); *H01L 2224/40247* (2013.01); *H01L 2224/48137* (2013.01); *H01L 2224/48247* (2013.01); *H01L 2224/73221* (2013.01); *H01L 2224/8412* (2013.01); *H01L 2224/8512* (2013.01)

(58) Field of Classification Search
USPC .................................................. 257/669, 44
See application file for complete search history.

(56) References Cited

U.S. PATENT DOCUMENTS

| | | | |
|---|---|---|---|
| 7,242,077 | B2 | 7/2007 | Ma et al. |
| 7,834,431 | B2 | 11/2010 | Hooper et al. |
| 8,268,676 | B2 | 9/2012 | Krishnan et al. |
| 8,912,640 | B2 | 12/2014 | Takada et al. |
| 2005/0199986 | A1 | 9/2005 | Ma et al. |
| 2009/0250795 | A1 | 10/2009 | Hooper et al. |
| 2011/0115061 | A1 | 5/2011 | Krishnan et al. |
| 2012/0228696 | A1 | 9/2012 | Carpenter et al. |
| 2013/0009299 | A1 | 1/2013 | Takada et al. |
| 2015/0262961 | A1* | 9/2015 | Jones ...................... H01L 23/66 257/532 |
| 2019/0074243 | A1 | 3/2019 | Sander et al. |
| 2019/0295957 | A1* | 9/2019 | Inumiya ................ H10B 63/34 |
| 2020/0176371 | A1* | 6/2020 | Ise ...................... H01L 23/3121 |

OTHER PUBLICATIONS

CN First Office Action and Search Report for counterpart CN Appl. No. 202210951094.5, report dated Aug. 11, 2025, 7 pgs.

* cited by examiner

SEMICONDUCTOR DEVICE AND ASSORTMENT OF SEMICONDUCTOR DEVICES WITH ELECTRICALLY CONDUCTIVE RIBBON CONFIGURATIONS

PRIORITY CLAIM

This application claims the priority benefit of Italian Application for Patent No. 102021000021638, filed on Aug. 10, 2021, the content of which is hereby incorporated by reference in its entirety to the maximum extent allowable by law.

TECHNICAL FIELD

The description relates to semiconductor devices.

One or more embodiments can be applied to semiconductor power devices for the automotive sector, for instance.

BACKGROUND

In various semiconductor products such as power Quad-Flat-No lead (QFN) packages plural integrated circuit chips or dice (a power die and a controller die, for instance) share a common package layout.

Also, in such power devices a same substrate (a pre-molded leadframe, for instance) can be used for manufacturing devices having different numbers of power channels: for instance, a substrate designed to host two power channels can be used for a device including only one power channel.

This may result in mounting a chip or die (these terms are used herein as synonyms) in a shifted, off-center position with respect to the substrate. The resulting asymmetric package structure is undesirably affected by a non-uniform behavior in respect of various parameters such as shrinkage and distribution of electrical and thermal flows.

There is a need in the art to deal adequately with the issues discussed in the foregoing.

SUMMARY

One or more embodiments relate to a method.

One or more embodiments relate to a corresponding semiconductor device. A power QFN package device is exemplary of such a device.

One or more embodiments relate to an assortment of corresponding semiconductor devices. An assortment comprising, e.g., single channel power devices and two-channel power devices produced using identical substrates is exemplary of such an assortment.

One or more embodiments provide a power semiconductor device such as a power QFN package where a single-channel arrangement (possibly including a "small" die) exploits a two-channel pre-molded leadframe with a symmetrical layout.

To that effect, one or more embodiments may comprise an electrically-conductive ribbon coupling a single power die to a two-channel leadframe. In certain embodiments, such a ribbon can be wedge-bonded across two power channels and a resin channel.

A single type of substrate (leadframe) can thus be used for different types of packages without redesigning die pad locations. This is advantageous in terms of reduced package design cycle time and, more generally, in terms of cost reduction.

BRIEF DESCRIPTION OF THE DRAWINGS

One or more embodiments will now be described, by way of example only, with reference to the annexed figures, wherein.

DETAILED DESCRIPTION

Figure 1:
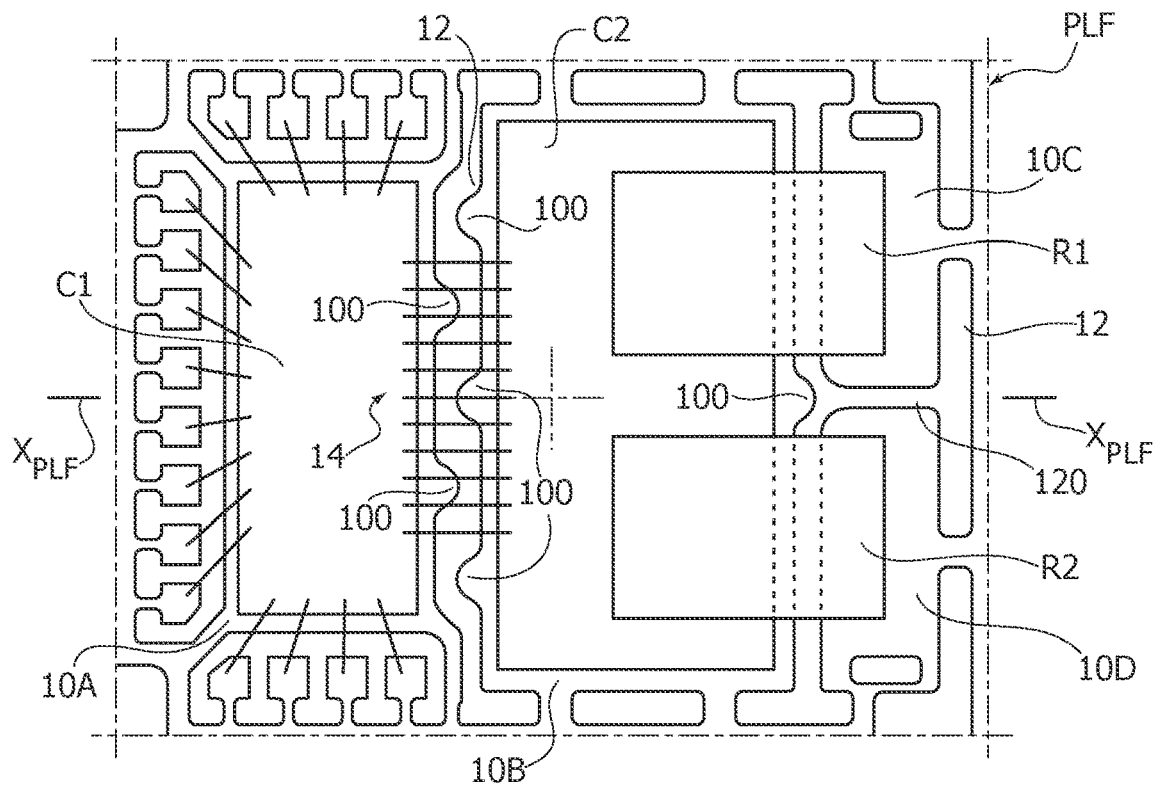
FIG. 1 is a plan view illustrative of a semiconductor power device including two power channels.

Corresponding numerals and symbols in the different figures generally refer to corresponding parts unless otherwise indicated.

The figures are drawn to clearly illustrate the relevant aspects of the embodiments and are not necessarily drawn to scale.

The edges of features drawn in the figures do not necessarily indicate the termination of the extent of the feature.

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment", "in one embodiment", or the like, that may be present in various points of the present description do not necessarily refer exactly to one and the same embodiment. Furthermore, particular configurations, structures, or characteristics may be combined in any adequate way in one or more embodiments.

The headings/references used herein are provided merely for convenience and hence do not define the extent of protection or the scope of the embodiments.

Semiconductor devices may comprise one or more semiconductor chips or dice arranged (attached) on substrates such as leadframes.

Plastic packages are commonly used for semiconductor devices. Such packages may include a leadframe providing a base substrate comprising electrically conductive material such as copper, sized and shaped to accommodate semiconductor chips or dice and providing pad connections (leads) for these chips or dice.

The designation "leadframe" (or "lead frame") is currently used (see, for instance the USPC Consolidated Glossary of the United States Patent and Trademark Office) to indicate a metal frame that provides support for an integrated circuit chip or die as well as electrical leads to interconnect the integrated circuit in the die or chip to other electrical components or contacts.

Leadframes are conventionally created using technologies such as a photo-etching technology. With this technology, metal (e.g., copper) material in the form of a foil or tape is etched on the top and bottom sides to create various pads and leads.

Substrates such as leadframes are advantageously provided in a pre-molded version wherein an insulating resin (an epoxy resin, for instance) fills the empty spaces between the die pads and leads.

A pre-molded leadframe is a thus a laminar substrate that is substantially flat with the pre-mold material (resin) filling the spaces in the electrically conductive structure (metal material such as copper, for instance) of the leadframe, that has been bestowed a sculptured appearance including empty spaces during forming, by etching, for instance.

The total thickness of the pre-mold leadframe is the same thickness of the sculptured electrically conductive structure.

FIG. 1 is a plan view of a power semiconductor device comprising a pre-molded leadframe PLF.

The pre-molded leadframe PLF comprises electrically conductive (for instance metal, e.g., copper) portions included in a sculptured, electrically conductive structure of the leadframe having spaces filled by the pre-mold material (resin).

A pre-molded leadframe PLF as illustrated in FIG. 1 comprises a number of electrically conductive pads 10A, 10B, 10C, 10D having spaces therebetween that are filled by pre-mold material 12 (an epoxy resin, for instance).

A power semiconductor device as (schematically) represented in FIG. 1 comprises: a die pad 10A configured to have arranged (attached) thereon a controller die C1; a die pad 10B configured to have arranged thereon a power die C2; and two electrically conductive pads 10C, 10D configured to have bonded (e.g., wedge-bonded) thereto electrically conductive ribbons R1, R2 configured to convey the (high) currents produced by the power die C2 towards an electrical load (not visible in the figures).

FIG. 1 is thus exemplary of a conventional "two-channel" device (the two channels or paths being provided by the two ribbons R1, R2) wherein a sculptured, electrically conductive laminar structure is provided having spaces therein. The laminar structure includes a plurality of electrically conductive pads 10A, 10B, 10C, 10D with pre-mold material 12 molded thereon. The pre-mold material 12 penetrates into the spaces formed (e.g., etched) in the sculptured, electrically conductive laminar structure and provides a laminar pre-molded substrate PLF including pads such as 10A, 10B, 10C, 10D left exposed by the pre-mold material 12 at the front or top surface of the leadframe PLF with the periphery of the pads 10A, 10B, 10C, 10D bordering on the pre-mold material 12 molded onto the laminar structure.

The sculpturing bestowed on the electrically conductive (metal, e.g., copper) portions of the (pre-molded) leadframe PLF is beneficial in keeping all the leadframe parts (leads and pads) together in a robust structure to facilitate the subsequent process steps.

For instance—after attaching the dice C1, C2 on the leadframe PLF, electrically bonding the dice C1, C2 with one another (e.g., via a wire bonding pattern 14) and electrically bonding the power die C2 to the pads 10C, 10D via the ribbons R1, R2—a subsequent process step may include a molding resin (not visible in the figure) molded on the resulting assembly to provide an insulating encapsulation of a final device.

The general structure of a power semiconductor device as exemplified in FIG. 1 is otherwise conventional in the art, which makes it unnecessary to provide a more detailed description herein. It is otherwise noted that referring to the specific case of a power semiconductor device including a controller die C1 and a power die C2 is merely exemplary and not limiting of the embodiments.

Specifically, FIG. 1 refers to a pre-molded leadframe PLF as disclosed in U.S. patent application Ser. No. 17/870,455, filed Jul. 21, 2022, corresponding to Italian patent application 102021000020111, filed Jul. 28, 2021, assigned to the same assignee of the present application and incorporated herein by reference.

A pre-molded leadframe PLF as illustrated in FIG. 1 comprises, at the periphery of the pads 10A and 10B, stress-relief (or stress-reducing) curved portions 100 configured to border on the pre-mold material 12 over a (lateral) rounded surface, that is over a smooth, curved surface (e.g., an even and regular surface free from perceptible projections, bumps, or indentations).

As illustrated, these stress-relief curved portions 100 may comprise, e.g., protrusions of the die pads 10A, 10B extending into the pre-mold material 12.

The stress-relief portions 100 may exhibit, when observed in a plan view, a profile which can be regarded as a serpentine, at least approximately sinusoidal trajectory with respect to a reference median line parallel to the (otherwise rectilinear) side of the die pad 10. That is, the stress-relief curved portions 100 extend in the plane of the laminar pre-molded substrate PLF (the thickness thereof is de facto negligible) along approximately sinusoidal trajectories. Such an approximately sinusoidal shape was found to be particularly effective in countering possible formation and propagation of cracks.

As appreciable on the right-hand side of FIG. 1, one of the stress-relief curved portion 100 of the die pad 10B is advantageously located at the same location where the pre-mold material 12 fills a T-shaped (originally) empty space in the electrically conductive structure of the leadframe turning what was a T-shaped space intended to be filled by the pre-mold material 12 into a Y-shaped space with rounded edges.

As also illustrated in FIG. 1, plural stress-relief curved portions 100 in the mutually facing sides of the neighboring die pads 10A and 10B can be provided as an alternation of (e.g., interdigitated) stress-relief curved portions 100 (protrusions, for instance) so that the pre-mold material 12 therebetween has a general zigzag or serpentine pattern.

The semiconductor device illustrated in FIG. 1 is thus an example of a semiconductor device comprising: a mounting substrate (leadframe) PLF for semiconductor dice comprising at least one die pad 10B; a semiconductor die C2 arranged on that die pad 10B; and a first electrically conductive ribbon R1 and a second electrically conductive ribbon R2 electrically coupling the semiconductor die C2 arranged on the die pad 10B with the first electrically conductive pad 10C and the second electrically conductive pad 10D, respectively.

As illustrated in FIG. 1, the first electrically conductive ribbon R1 and the second electrically conductive ribbon R2 extend in a longitudinal direction $X_{PLF}$ on opposite sides of a strip of insulating material 120 between the electrically conductive pads 10C and 10D.

As illustrated in FIG. 1, the longitudinal direction $X_{PLF}$ is identified by a median axis (horizontal in FIG. 1) of the substrate PLF, with the axis $X_{PLF}$ extending through the strip 120 of insulating material 12 between the electrically conductive pads 10C and 10D.

The electrically conductive pads 10C and 10D thus lie on opposite sides of the strip of insulating material 120.

The first electrically conductive ribbon R1 provides a first current conduction path from the semiconductor die C2 to the first electrically conductive pad 10C, while the second electrically conductive ribbon R2 provides a second current conduction path from the semiconductor die C2 to the second electrically conductive pad 10D.

The first current conduction path provided by the ribbon R1 is distinct from the second current conduction path provided by the ribbon R2.

As illustrated on the left-hand side of FIG. 1, the substrate PLF also comprises a further die pad 10A, with the die pad 10B lying intermediate such further die pad 10A and the first and second electrically conductive pads 10C and 10D.

As illustrated in FIG. 1, a further semiconductor die (e.g., a controller die C1) is arranged on the further die pad 10A in register, that is, with a center line of die C1 aligned with the axis $X_{PLF}$, namely with the strip of insulating material 120 between the electrically conductive pads 10C and 10D.

As illustrated in FIG. 1, the wire bonding pattern 14 electrically coupling the semiconductor die C1 on the die pad 10A and the semiconductor die C2 on the die pad 10B is in register, that is, a centerline bisecting the wire bonding pattern aligned with the axis $X_{PLF}$, namely with the strip of insulating material 120 between the first electrically conductive pad 10C and the second electrically conductive pad 10D.

By way of the in register arrangement, the various elements of the device illustrated in FIG. 1 are thus arranged in a substantially symmetrical way with respect to the axis $X_{PLF}$.

It will be noted that this in register arrangement further applies to the pair of pads 10C, 10D and the pair of ribbons R1, R2, which lie on opposite sides of the insulating strip 120 (axis $X_{PLF}$). Furthermore, each of the dice C1, C2 and the wire bonding pattern 14 are arranged in register, that is, aligned with the axis $X_{PLF}$.

Various applications benefit from the availability of a product "family" including controllers and/or power dice with different sizes and power-handling capabilities.

Figure 2:
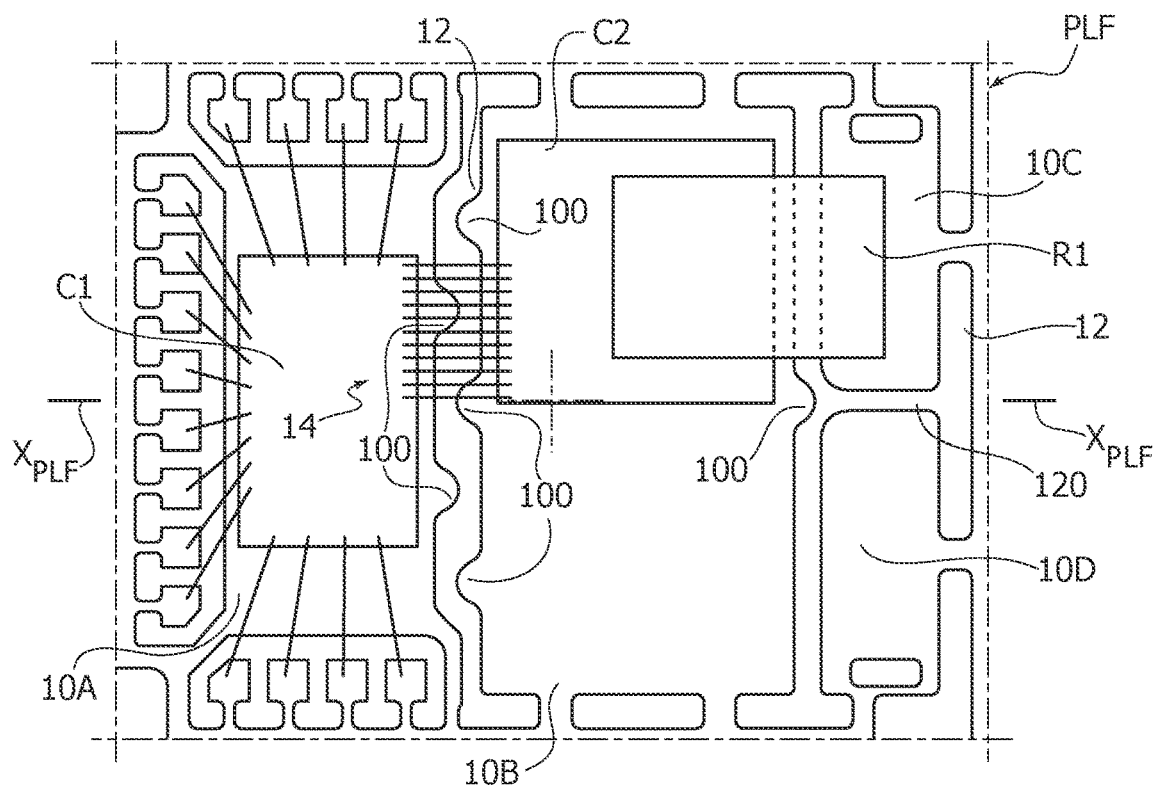
FIG. 2 is exemplary of the possibility of using the same substrate (leadframe) of the device of FIG. 1 to manufacture a semiconductor power device having a single power channel.

For instance, as illustrated in FIG. 2, certain applications may involve a controller die C1 and/or a power die C2 of a smaller size than the dice C1 and C2 illustrated in FIG. 1.

It is again noted that referring to the specific case of a power semiconductor device including a controller die C1 and a power die C2 is otherwise merely exemplary and not limiting of the embodiments.

The capability of using a same (pre-molded) leadframe PLF for different members of a product family or assortment (such as those illustrated in FIGS. 1 and 2) is a desirable feature.

As illustrated in FIG. 2, this may result in the option of placing the (smaller) power die C2 over just a portion (the upper one, in FIG. 2) of the die pad 10B that, in a dual-channel arrangement as illustrated in FIG. 1, hosts a (larger) chip C2.

A device as illustrated in FIG. 2 is a "single-channel" device including only one ribbon R1 configured to convey the current produced by the die C2 towards the electrically conductive pad 10C and on to an external electrical load (not visible in the figures).

A solution as exemplified in FIG. 2 has the disadvantage of leading to an asymmetric package structure.

In fact, in an arrangement as exemplified in FIG. 2, the die C2 and the ribbon R1 are both arranged sidewise of (e.g., offset from, on either side of) the axis $X_{PLF}$. This also inevitably applies to the wire bonding pattern 14 even if the die C1 can still be arranged in register, that is, aligned with, the axis $X_{PLF}$.

An arrangement as exemplified in FIG. 2 may exhibit an undesired non-uniform behavior in terms of shrinkage and electrical and thermal performance.

These issues could be addressed by resorting to a different leadframe layout (which however has negative effects on design and cost) and, at least as a palliative, by selecting components (glue, tape, resin) with improved properties and/or selecting different die thicknesses.

Various problems would however remain unsolved: for instance (this can be appreciated by comparing FIG. 1 and FIG. 2) mounting the power pad C2 laterally offset with respect to the leadframe PLF almost inevitably entails a possible modification of the wire bonding pattern 14 that is likewise shifted laterally.

Figure 3:
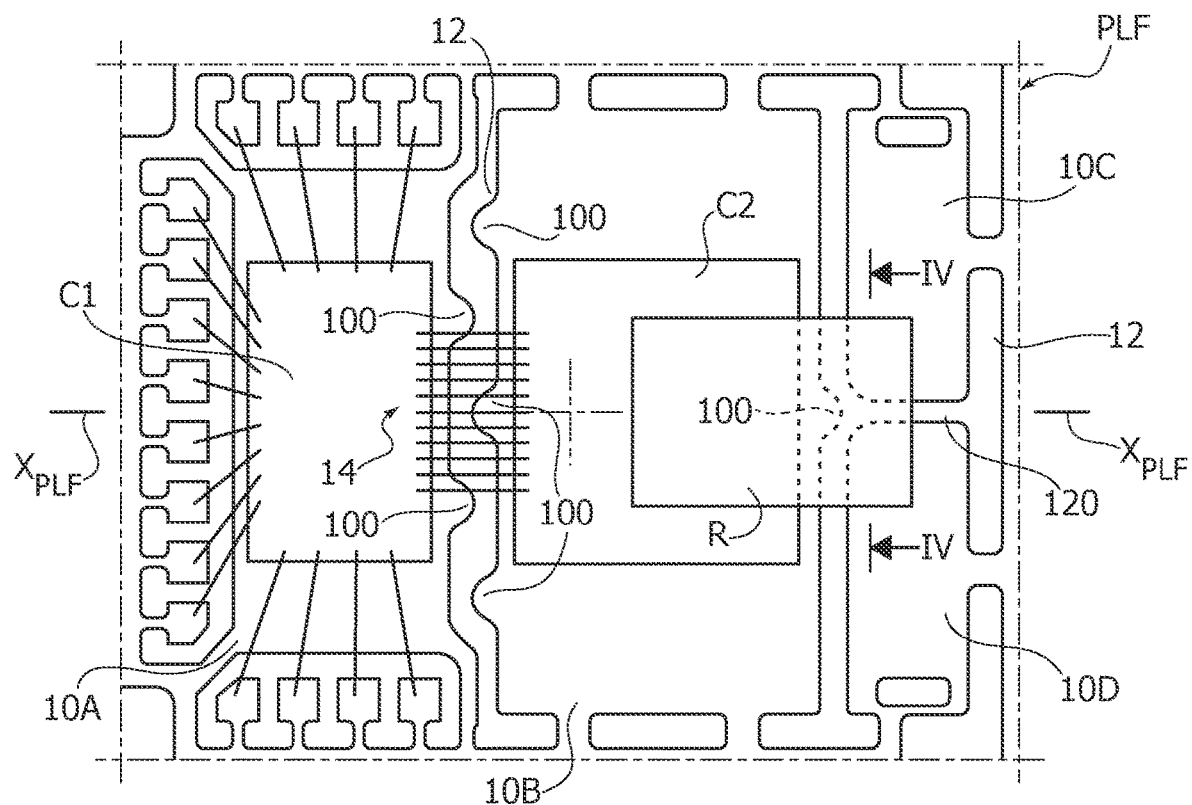
FIG. 3 is a plan view illustrative of the substrate shown in FIGS. 1 and 2 used to manufacture a semiconductor power device having a single power channel according to embodiments of the present description.
Figure 4:
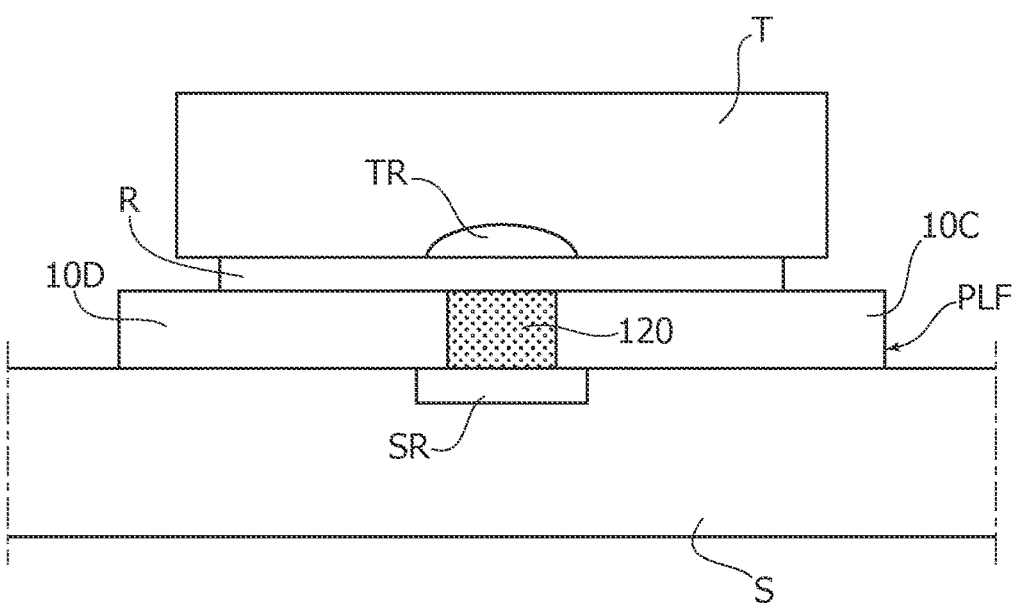
FIG. 4 is a cross-sectional view along line IV-IV of FIG. 3 reproduced on an enlarged scale.

Examples as represented in FIGS. 3 and 4 facilitate placing a (power) die such as the die C2 in a single-channel arrangement on the same type of a leadframe PLF used for a two-channel device as exemplified in FIG. 1, while retaining an "aligned" or "symmetric" structure: that is, a single-channel structure wherein the chips C1 and C2, the ribbon R1 and the wire bonding 14 are all in register, that is, aligned with the median longitudinal axis $X_{PLF}$ of the leadframe PLF though the strip 120, with the leadframe PLF being otherwise identical to the leadframe used in the case of a two-channel device as illustrated in FIG. 1.

Embodiments as illustrated in FIGS. 3 and 4 facilitate placing a die such as power die C2 centrally of the leadframe PLF in register with the median axis $X_{PLF}$ through the strip 120.

In that way, the disadvantages discussed previously and related to an asymmetrical, off-center package structure can be overcome: as an example, as illustrated in FIG. 3, a central wire bonding pattern 14 can be retained for a single-channel device as in the case of a two-channel device as illustrated in FIG. 1.

Such a result (placing the power die C2 in register with the median axis $X_{PLF}$) can be achieved by exploiting a (single) ribbon R intended to provide a current flow path (channel) from the chip C2.

As illustrated in FIGS. 3 and 4, the distal end of the ribbon R (opposite the die C2) can be arranged astride the strip 120 and the axis $X_{PLF}$ and coupled (e.g., by conventional wedge bonding) to the pads 10C and 10D.

The ribbon R can thus provide electrical connection as desired between the die C2 and (both) the pads 10C and 10D by so-to-say, short-circuiting the pre-mold material (resin) 120 between the two pads 10C and 10D. The distal end of the ribbon R thus extends bridge-like between the pads 10C, 10D and provides electrical connection as desired between the die C2 and the pads 10C and 10D.

This facilitates placing the die C2 at the axis $X_{PLF}$ with the ribbon R providing electrical bonding as desired to the two pads 10C and 10D.

In that way, a symmetrical structure is produced that overcomes the shrinkage issues and electrical and thermal performance issues discussed in the in the foregoing, while retaining the possibility of using a substrate (leadframe) PLF designed for two-channel device (also) for a single-channel device.

Those of skill in the art will otherwise appreciate that the same concept can be applied, for instance, to facilitate (re)using a substrate devised for a four-channel power device (with four pads in the place of the two pads 10C, 10D as illustrated on the right-hand side of FIG. 3) in producing a two-channel device with a first ribbon placed astride the first and the second pad and a second ribbon placed astride the third and the fourth pad.

FIG. 4 is exemplary of the possibility of coupling the ribbon R to the pads 10C and 10D using a customized bonding tool (this may be an otherwise conventional tool as currently used in "wedge-bonding" ribbons in power semiconductor devices) comprising complementary portions T and S (this may be a metal support plate) configured to clamp the ribbon R and the pads 10C, 10D.

In the example of FIG. 4, the tool T and the plate S have respective recesses TR and SR aligned with the axis $X_{PLF}$ extending at the pre-mold (resin) material 120 between the pads 10C and 10D.

Such an arrangement was found to be advantageous in avoiding applying undesired stress to the pre-mold material in the strip 120 which may be in the form of relatively narrow strip between the pads 10C, 10D.

The examples presented herein thus facilitate making available to a user an assortment (that is a "family") of semiconductor devices comprising, e.g.: single-channel power devices as exemplified in FIG. 3, and two-channel power devices as exemplified in FIG. 1.

The various devices in the family/assortment can comprise identical substrates PLF (as illustrated in both FIGS. 1 and 3), while avoiding giving rise to off-center arrangements as illustrated in FIG. 2.

Without prejudice to the underlying principles, the details and embodiments may vary, even significantly, with respect to what has been described in the foregoing, by way of example only, without departing from the extent of protection.

The claims are an integral part of the technical teaching provided herein in respect of the embodiments.

The extent of protection is determined by the annexed claims.

The invention claimed is:

1. A semiconductor device, comprising:
a mounting substrate comprising at least one die pad as well as a first electrically conductive pad and a second electrically conductive pad with a strip of insulating material between the first and second electrically conductive pads, wherein the strip of insulating material extends in a longitudinal direction with the first electrically conductive pad and the second electrically conductive pad lying on opposite sides of the strip of insulating material and being mutually electrically insulated by the strip of insulating material;
at least one further die pad in the mounting substrate, wherein the at least one die pad lies intermediate the at least one further die pad and the first and second electrically conductive pads;
a semiconductor die arranged on said at least one die pad in register with the strip of insulating material;
a further semiconductor die arranged on said at least one further die pad in register with the strip of insulating material;
a wire bonding pattern electrically coupling the further semiconductor die arranged on said at least one further die pad and the semiconductor die arranged on said at least one die pad, the wire bonding pattern in register with the strip of insulating material between the first electrically conductive pad and the second electrically conductive pad; and
a single electrically conductive ribbon electrically coupling the semiconductor die arranged on said at least one die pad with the first electrically conductive pad and the second electrically conductive pad, the single electrically conductive ribbon extending in said longitudinal direction in register with the strip of insulating material, wherein the single electrically conductive ribbon electrically contacts the first electrically conductive pad and the second electrically conductive pad that lie on opposite sides of the strip of insulating material and provides a current flow path from the semiconductor die arranged on said at least one die pad towards the first and second electrically conductive pads.

2. The semiconductor device of claim 1, wherein the strip of insulating material between the first electrically conductive pad and the second electrically conductive pad extends along a median axis of the mounting substrate.

3. The semiconductor device of claim 2, wherein a center line of the single electrically conductive ribbon is aligned along the median axis with a center line of the strip of insulating material.

4. An assortment of semiconductor devices, comprising:
a first semiconductor device and a second semiconductor device;
wherein each of the first and second semiconductor devices comprises:
a mounting substrate comprising at least one die pad as well as a first electrically conductive pad and a second electrically conductive pad with a strip of insulating material between the first and second electrically conductive pads, wherein the strip of insulating material extends in a longitudinal direction with the first electrically conductive pad and the second electrically conductive pad lying on opposite sides of the strip of insulating material and being mutually electrically insulated by the strip of insulating material; and
a semiconductor die arranged on said at least one die pad in register with the strip of insulating material;
wherein the first semiconductor device comprises:
a single electrically conductive ribbon electrically coupling the semiconductor die arranged on said at least one die pad with the first electrically conductive pad and the second electrically conductive pad, the single electrically conductive ribbon extending in said longitudinal direction in register with the strip of insulating material, wherein the single electrically conductive ribbon electrically contacts the first electrically conductive pad and the second electrically conductive pad that lie on opposite sides of the strip of insulating material and provides a current flow path from the semiconductor die arranged on said at least one die pad towards the first and second electrically conductive pads; and
wherein the second semiconductor device comprises:
first and second electrically conductive ribbons electrically coupling the semiconductor die arranged on said at least one die pad with the first electrically conductive pad and the second electrically conductive pad, the first and second electrically conductive ribbons extending in said longitudinal direction on opposite sides of the respective strip of insulating material, wherein the first electrically conductive ribbon provides a first current conduction path from the semiconductor die arranged on said at least one die pad towards the first electrically conductive pad, and the second electrically conductive ribbon provides a second current conduction path from the semiconductor die arranged on said at least one die pad towards the second electrically conductive pad, the first current conduction path being distinct from the second current conduction path.

5. The assortment of semiconductor device of claim 4, wherein for each of the first and second semiconductor devices, the strip of insulating material between the first electrically conductive pad and the second electrically conductive pad extends along a median axis of the mounting substrate.

6. The assortment of semiconductor device of claim 5, wherein a center line of the single electrically conductive ribbon is aligned along the median axis with a center line of the strip of insulating material.

7. The assortment of semiconductor device of claim 5, wherein the first electrically conductive ribbon is arranged on one side of the median axis and the second electrically conductive ribbon is arranged on an opposite side of the median axis.

8. A semiconductor device, comprising:
a mounting substrate comprising at least one die pad as well as a first electrically conductive pad and a second electrically conductive pad with a strip of insulating material between the first and second electrically conductive pads, wherein the strip of insulating material extends in a longitudinal direction with the first electrically conductive pad and the second electrically conductive pad lying on opposite sides of the strip of insulating material and being mutually electrically insulated by the strip of insulating material;
a semiconductor die arranged on said at least one die pad in register with the strip of insulating material; and
a single electrically conductive ribbon electrically coupling the semiconductor die arranged on said at least one die pad with the first electrically conductive pad and the second electrically conductive pad, the single electrically conductive ribbon extending in said longitudinal direction in register with the strip of insulating material, wherein the single electrically conductive ribbon electrically contacts the first electrically conductive pad and the second electrically conductive pad that lie on opposite sides of the strip of insulating material and provides a current flow path from the semiconductor die arranged on said at least one die pad towards the first and second electrically conductive pads;
wherein a distal end of the single electrically conductive ribbon extends as a bridge over and in contact with the strip of insulating material between the first electrically conductive pad and the second electrically conductive pad.

9. A semiconductor device, comprising:
a mounting substrate comprising at least one die pad as well as a first electrically conductive pad and a second electrically conductive pad with a strip of insulating material between the first and second electrically conductive pads, wherein the strip of insulating material extends in a longitudinal direction with the first electrically conductive pad and the second electrically conductive pad lying on opposite sides of the strip of insulating material and being mutually electrically insulated by the strip of insulating material;
a semiconductor die arranged on said at least one die pad in register with the strip of insulating material; and
a single electrically conductive ribbon having a first end electrically coupled to the semiconductor die arranged on said at least one die pad and having a second end with a wedge bond connection to both the first electrically conductive pad and the second electrically conductive pad, the single electrically conductive ribbon extending in said longitudinal direction in register with the strip of insulating material, wherein the second end of the single electrically conductive ribbon bridges over and contacts the strip of insulating material lying between the first electrically conductive pad and the second electrically conductive pad, said single electrically conductive ribbon providing a current flow path from the semiconductor die arranged on said at least one die pad towards the first and second electrically conductive pads.

10. The semiconductor device of claim 9, wherein the strip of insulating material between the first electrically conductive pad and the second electrically conductive pad extends along a median axis of the mounting substrate.

11. The semiconductor device of claim 9, wherein a center line of the single electrically conductive ribbon is aligned along the median axis with a center line of the strip of insulating material.

* * * * *